United States Patent
Meadowcroft et al.

(10) Patent No.: US 8,260,097 B2
(45) Date of Patent: Sep. 4, 2012

(54) OPTO-ELECTRONIC ALIGNMENT SYSTEM AND METHOD

(75) Inventors: David J. K. Meadowcroft, San Jose, CA (US); Seng-Kum Chan, Santa Clara, CA (US); Ronald T. Kaneshiro, Los Altos, CA (US); Ye Chen, San Jose, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 3 days.

(21) Appl. No.: 12/817,008

(22) Filed: Jun. 16, 2010

(65) Prior Publication Data

US 2011/0311182 A1    Dec. 22, 2011

(51) Int. Cl.
*G02B 6/12* (2006.01)
*G02B 6/32* (2006.01)

(52) U.S. Cl. ............................................ 385/14; 385/33
(58) Field of Classification Search .................... 385/14, 385/33
See application file for complete search history.

(56) References Cited

U.S. PATENT DOCUMENTS

| | | | |
|---|---|---|---|
| 5,812,717 A * | 9/1998 | Gilliland ........................... | 385/93 |
| 5,841,562 A * | 11/1998 | Rangwala et al. ............. | 398/139 |
| 5,963,684 A * | 10/1999 | Ford et al. ........................ | 385/24 |
| 6,283,644 B1 * | 9/2001 | Gilliland et al. .................. | 385/93 |
| 6,302,596 B1 * | 10/2001 | Cohen et al. ..................... | 385/93 |
| 6,416,238 B1 * | 7/2002 | Gilliland et al. ................. | 385/88 |
| 6,445,858 B1 | 9/2002 | Musk | |
| 6,550,983 B1 * | 4/2003 | Gilliland et al. ................. | 385/93 |
| 6,597,713 B2 * | 7/2003 | Ouchi ............................. | 372/36 |
| 6,736,553 B1 | 5/2004 | Stiehl et al. | |
| 6,845,118 B1 * | 1/2005 | Scott ............................... | 372/96 |
| 6,851,870 B1 * | 2/2005 | Deng et al. ....................... | 385/93 |
| 6,869,232 B2 * | 3/2005 | Schunk et al. .................. | 385/93 |
| 6,954,592 B2 * | 10/2005 | Tan et al. ....................... | 398/138 |
| 7,061,949 B1 * | 6/2006 | Zhou et al. ....................... | 372/36 |
| 7,076,860 B2 | 7/2006 | Jenner et al. | |
| 7,322,754 B2 * | 1/2008 | Wolf et al. ...................... | 385/93 |
| 7,344,318 B2 | 3/2008 | Lu et al. | |
| 7,396,139 B2 * | 7/2008 | Savage .......................... | 362/101 |
| 7,535,949 B2 | 5/2009 | Wang et al. | |
| 2001/0024551 A1 * | 9/2001 | Yonemura et al. .............. | 385/88 |
| 2002/0126356 A1 * | 9/2002 | Nakanishi et al. ............. | 359/163 |
| 2002/0196500 A1 * | 12/2002 | Cohen et al. ................... | 359/152 |
| 2003/0118343 A1 * | 6/2003 | Ohe et al. ...................... | 398/139 |
| 2003/0152336 A1 * | 8/2003 | Gurevich et al. ................ | 385/88 |
| 2003/0210866 A1 * | 11/2003 | Kuhara et al. ................... | 385/49 |
| 2004/0022487 A1 * | 2/2004 | Nagasaka et al. ............... | 385/31 |
| 2004/0105627 A1 * | 6/2004 | Hargis et al. .................... | 385/88 |
| 2004/0208601 A1 * | 10/2004 | Tan et al. ....................... | 398/135 |
| 2005/0062119 A1 * | 3/2005 | Gallup et al. .................. | 257/414 |
| 2005/0244111 A1 * | 11/2005 | Wolf et al. ...................... | 385/93 |
| 2006/0088255 A1 * | 4/2006 | Wu et al. ......................... | 385/92 |
| 2006/0192221 A1 * | 8/2006 | Zhou et al. ....................... | 257/98 |
| 2007/0051877 A1 * | 3/2007 | Sakai et al. ................. | 250/214 R |
| 2009/0046456 A1 * | 2/2009 | Urano et al. ................... | 362/235 |
| 2011/0229087 A1 * | 9/2011 | Cody et al. ..................... | 385/78 |

* cited by examiner

*Primary Examiner* — K. Cyrus Kianni

(57) ABSTRACT

Alignment of one or more lenses with one or more opto-electronic devices in an opto-electronic system is aided by an aligner device having a substantially cylindrical body with a base and an outer ring. The base has one or more openings, one of which is a first opto-electronic device opening. The first opto-electronic device opening has a substantially circular shape coaxial with the outer ring and coaxial with a central axis of the aligner device.

19 Claims, 12 Drawing Sheets

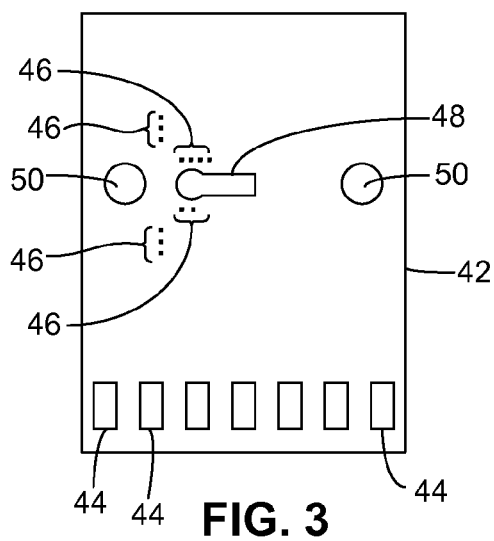
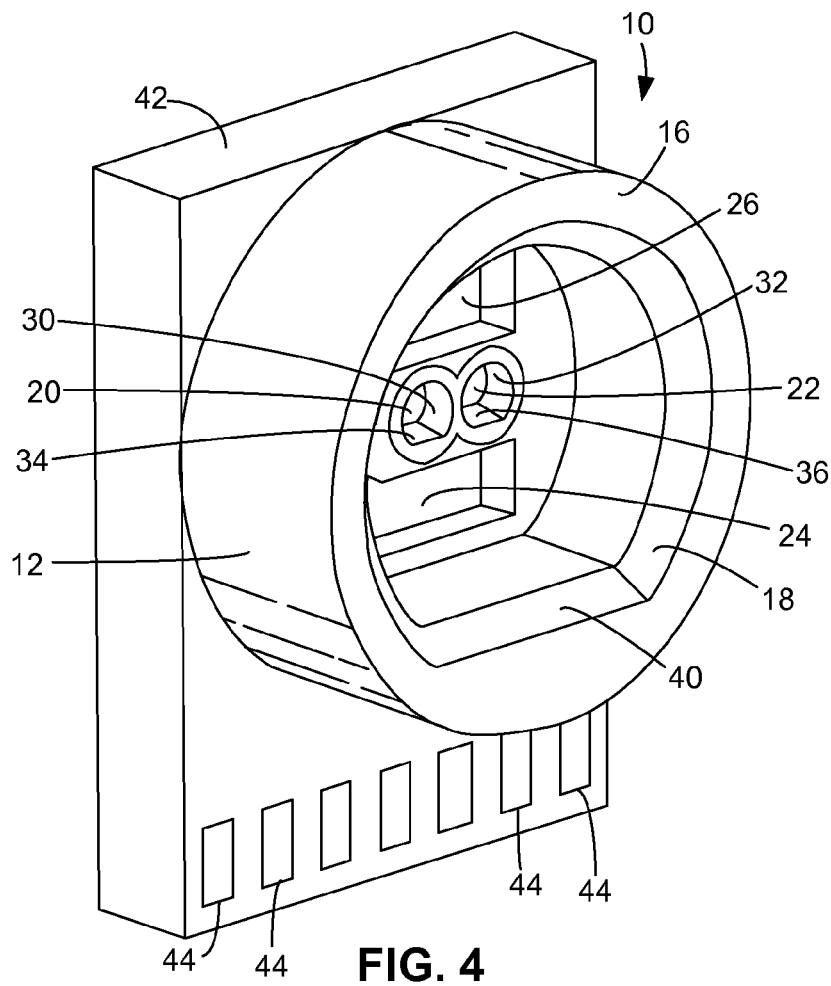

OPTO-ELECTRONIC ALIGNMENT SYSTEM AND METHOD

BACKGROUND

In an optical communication system, it is generally necessary to couple an an opto-electronic light source device, such as a laser, or an opto-electronic light receiver device, such as a photodiode, to another element of the system, such as an optical fiber. A collimating lens and a focusing lens are commonly mounted in front of the light source device and light receiver device, respectively. The light source device, light receiver device and lenses or other optical elements can be packaged together in an opto-electronic module. Such a module commonly also includes one or more electronic devices, such as a driver integrated circuit chip that provides an electrical interface for the light source device and a receiver integrated circuit chip that provides an electrical interface for the light receiver device. The light receiver device converts optical signals that impinge upon it into electrical signals, which are output from the transceiver module via the receiver integrated circuit chip. Likewise, the light source device emits optical signals in response to electrical signals that are input to the transceiver module via the driver integrated circuit chip.

Aligning the lenses with the opto-electronic devices can present challenges. One lens alignment method, which is commonly referred to as passive alignment, involves using a machine known as an X-Y precision aligner. An X-Y precision aligner is a robotic machine that places the lens on a portion of the transceiver module in alignment with the opto-electronic device based on the dimensions of the device. Another lens alignment method, which is commonly referred to as active alignment, involves using a similar machine that places the lens substantially in alignment with the opto-electronic device while the device is powered, and then adjusts the lens position based upon a feedback signal representing a measurement of light output level from a light source or light sensitivity level of a light receiver until a lens position is found at which the measurement is maximized. Both of these methods are relatively slow, resulting in low manufacturing output (i.e., units per hour). Furthermore, the machines are expensive. The combination of relatively low manufacturing output and high manufacturing cost impacts the cost per transceiver module manufactured.

SUMMARY

Embodiments of the present invention relate to aligning one or more lenses with one or more opto-electronic devices in an opto-electronic system. Alignment is aided by an aligner device having a substantially cylindrical body with a base and an outer ring. The base has one or more openings, one of which is a first opto-electronic device opening. The first opto-electronic device opening is coaxial with the outer ring and coaxial with a central axis of the aligner device.

An alignment method can include placing an opto-electronic device in the first opto-electronic device opening. The opto-electronic device has a periphery of dimensions providing a snug fit within the first opto-electronic device opening. For example, an opto-electronic device having a square periphery can be push-fit within a first opto-electronic device opening having a circular shape circumscribes the square shape of the opto-electronic device. The periphery of the first opto-electronic device opening provides an alignment surface for aligning the opto-electronic device with respect to the central axis and retaining the opto-electronic device against movement with respect to the aligner device. An optical device, such as a lens device that includes at least one lens, can be mated to the outer ring of the aligner device. The optical device and the outer ring have mating alignment surfaces for aligning the optical device with the opto-electronic device and retaining the optical device against movement with respect to the aligner device.

A system, such as a portion or assembly of an opto-electronic transceiver, can be constructed by mounting the aligner device to a substantially planar substrate, such as a printed circuit board, flexible printed circuit, lead frame, or ceramic substrate.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

FIG. 3 is a top plan view of a printed circuit board substrate in accordance with the exemplary embodiment of the invention.

FIG. 4 perspective view of the aligner device of FIGS. 1-2 mounted on the substrate of FIG. 3, showing the front of the resulting assembly.

DETAILED DESCRIPTION

Figure 1:
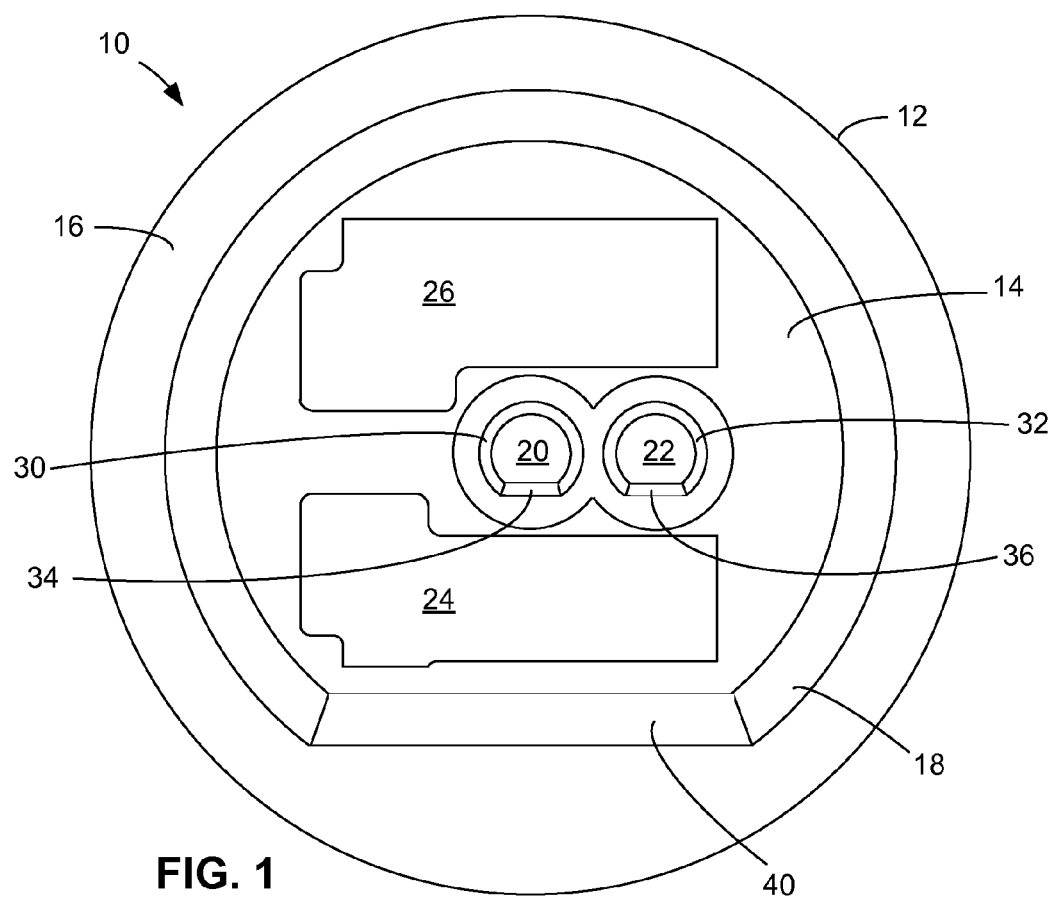
FIG. 1 is a top plan view of an aligner device in accordance with an exemplary embodiment of the invention.
Figure 2:
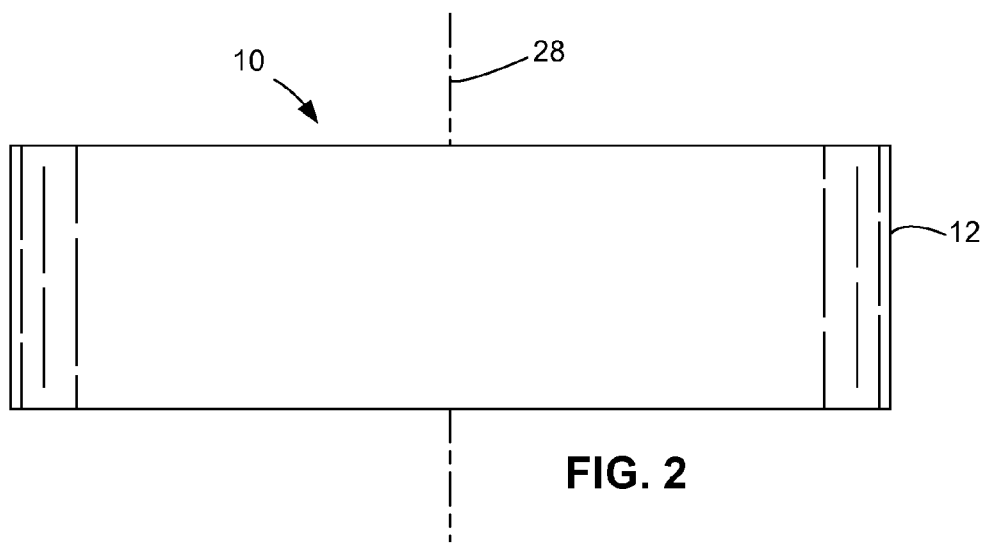
FIG. 2 is a side elevation view of the aligner device of FIG. 1.
Figure 5:
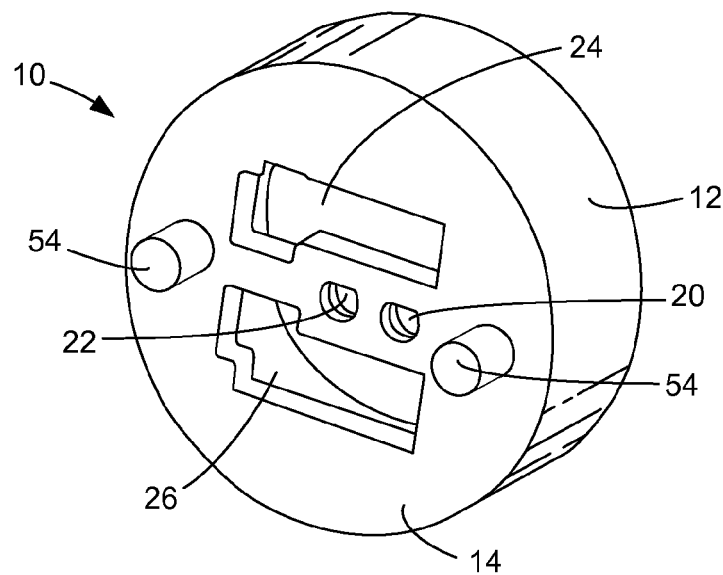
FIG. 5 is a rear perspective view of the aligner device of FIGS. 1-2.

As illustrated in FIGS. 1-2, in an illustrative or exemplary embodiment of the invention, an aligner device 10 has a substantially disc-shaped or cylindrical body 12. Body 12 has a base 14 near one end, i.e., recessed into body 12. A substantially cylindrical outer ring 16 of body 12 that generally defines the cylindrical shape has a chamfered edge 18. Base 14 has a first opto-electronic device opening 20, a second opto-electronic device opening 22, a first electronic device opening 24, and a second electronic device opening 26. First and second opto-electronic device openings 20 and 22 have substantially circular shapes. First opto-electronic device opening 20 is coaxial with outer ring 16, and coaxial with a central axis 28 (FIG. 2) of aligner device 10. These openings are used in the manner described below. Although in the exemplary embodiment body 10 has the four above-described openings, in other embodiments a similar aligner device body can have more or fewer such openings. Body 12 can be made of, for example, a rigid moldable plastic material. An example of a rigid moldable plastic material that is commonly used in optical devies is ULTEM® polyetherimide from SABIC (formerly General Electric Plastics Division). A liquid crystal polymer is another example of a rigid moldable plastic material that may be suitable.

First and second opto-electronic device openings 20 and 22 have chamfered edges 30 and 32, respectively. First and second opto-electronic device openings 20 and 22 also have straight-edged portions 34 and 36, respectively. Thus, the shapes of first and second opto-electronic device openings 20 and 22 are only "substantially" circular and not exclusively or exactly circular. Straight-edged portions 34 and 36 are chamfered along with chamfered edges 30 and 32. Outer ring 16 has a similar straight-edged portion 40 that is chamfered along with chamfered edge 18.

Although in the exemplary embodiment the exterior surface of body 12 is cylindrical and its interior is cylindrical but for straight-edged portion 40, in other embodiments body 12 can have other features that cause it to be only substantially cylindrical rather than exclusively or exactly cylindrical, such as features that aid its release from a mold. Nevertheless, body 12 is at least substantially cylindrical in that it has features that are formed symmetrically about central axis 28, as described in further detail below.

As illustrated in FIGS. 3-6, aligner device 10 can be mounted on a printed circuit board 42 or, in other embodiments, any other suitable substrate, such as a flexible printed circuit, metal lead frame (not shown), or ceramic substrate. The front or top surface of printed circuit board 42 has electrical contacts 44, contact pads 46, and a heat sink pad portion 48 (FIG. 3). Two mounting holes 50 extend through printed circuit board 42 between the front and rear surfaces. The rear or bottom surface of printed circuit board 42 has a heat sink trace 52 (FIG. 6) that is coupled to heat sink pad portion 48 through a via or plated-through hole (not shown) that extends through printed circuit board 42. Two protuberances 54 on the rear of base 14 of aligner device 10 (FIG. 5) can be extended through mounting holes 50 and heat-staked to secure aligner device 10 to printed circuit board 42. Although in the exemplary embodiment a pair of protuberances 54 and corresponding mounting holes 50 are used to mount aligner device 10, in other embodiments any other suitable mounting arrangement can be used.

Figure 7:
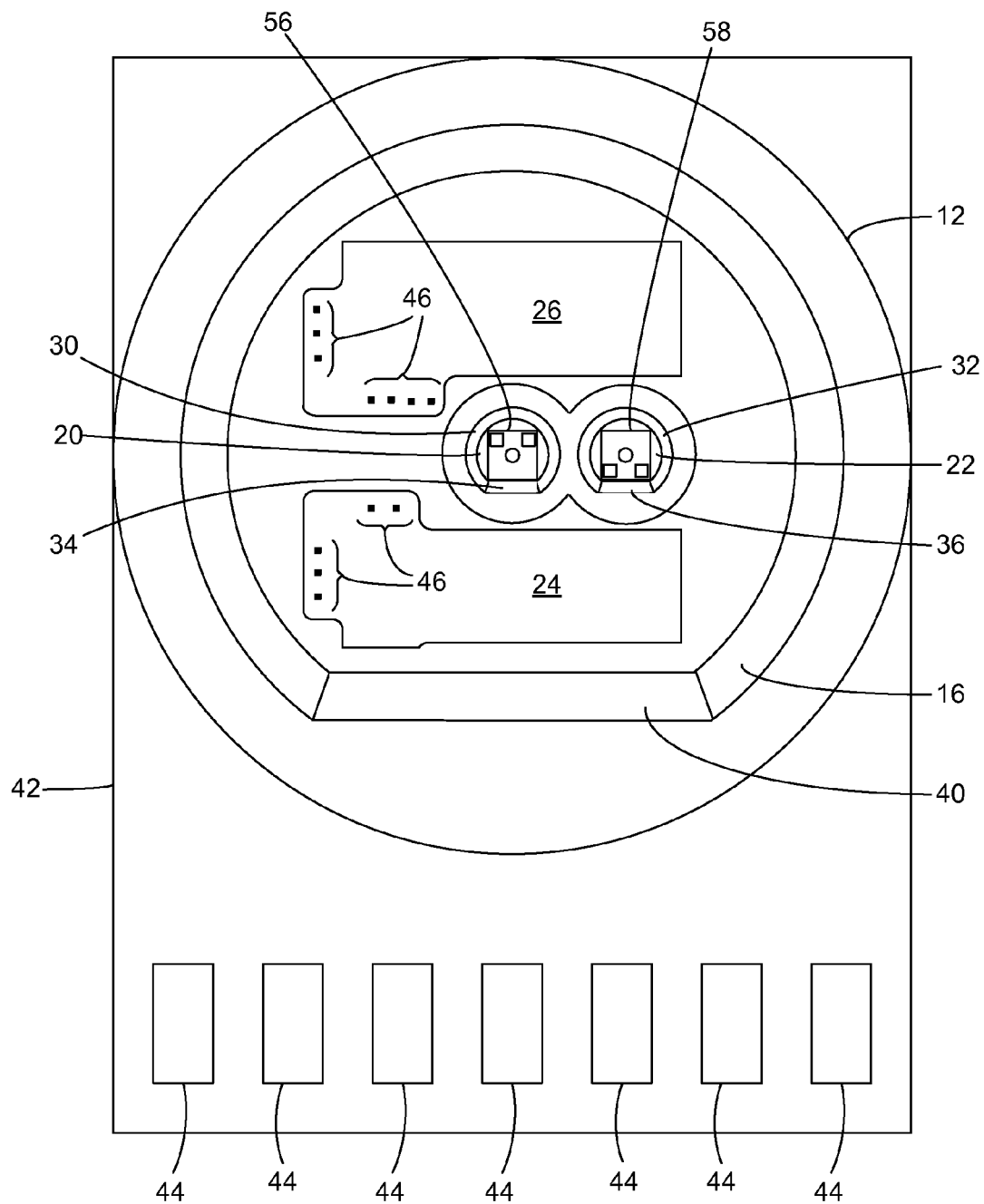
FIG. 7 is a top plan view of the front of the assembly of FIGS. 4 and 6, with opto-electronic devices mounted in first and second openings in the aligner device.

As illustrated in FIG. 7, a first opto-electronic device 56, such as a laser or similar light source, can be placed in first opto-electronic device opening 20. Likewise, a second opto-electronic device 58, such as a photodiode or similar light receiver, can be placed in second opto-electronic device opening 22. Although in the exemplary embodiment a light source and a light receiver are used, any other suitable set of one or more such opto-electronic devices can be used in other embodiments. For example, in other embodiments (not shown), there can be two or more light sources or two or more light receivers. A conventional robotic pick-and-place machine (not shown) of the type that is conventionally used to populate systems with integrated circuit chips or other electronic components can be used to place first and second opto-electronic devices 56 and 58 in first and second opto-electronic device openings 20 and 22, respectively. Chamfered edges 30 and 32 help guide first and second opto-electronic devices 56 and 58 into first and second opto-electronic device openings 20 and 22. Mounted in this manner, the corners of first and second opto-electronic devices 56 and 58, which have a square shape or periphery, just contact the circular peripheries of first and second opto-electronic device openings 20 and 22. This type of fit, where two mating parts fit snugly together or just barely contact each other, is known in the art as a transitional fit. A transitional fit can be contrasted with a friction fit, where some amount of force must be exerted upon a part to press it into an opening. A transitional fit can also be contrasted with a clearance fit, where all dimensions of the opening are larger than the corresponding dimensions of the part.

Also, straight-edged portions 34 and 36 help orient first and second opto-electronic devices 56 and 58 within first and second opto-electronic device openings 20 and 22, respectively, by promoting alignment with the straight edges of first and second opto-electronic devices 56 and 58. Straight-edged portions 34 and 36 also help retain first and second opto-electronic devices 56 and 58 against rotational movement with respect to aligner device 10.

Figure 6:
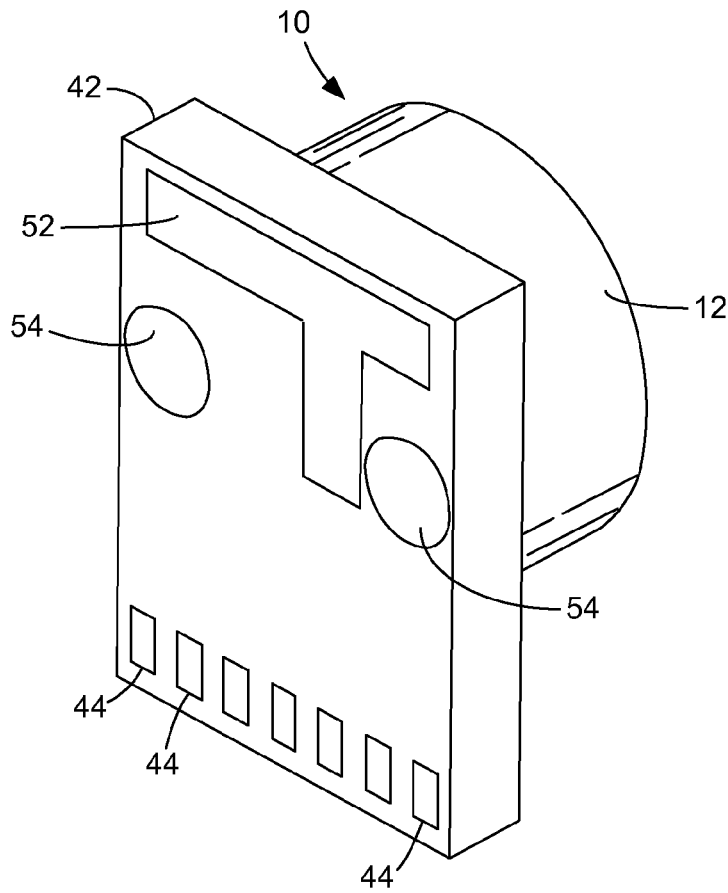
FIG. 6 is similar to FIG. 4, showing the rear of the assembly.

Also, mounted in the above-described manner, the back of first opto-electronic device 56 contacts heat sink pad portion 48 (FIG. 3), which can conduct excess heat away from first opto-electronic device 56 to heat sink trace 52 (FIG. 6). The backs of first and second opto-electronic devices 56 and 58 can be secured to printed circuit board 42 with a suitable adhesive, such as epoxy. Any small amount of excess epoxy that may seep from behind first and second opto-electronic devices 56 and 58 before the epoxy cures can escape harmlessly into the voids between the edges of first and second opto-electronic devices 56 and 58 and the peripheries of first and second opto-electronic device openings 20 and 22.

Figure 8:
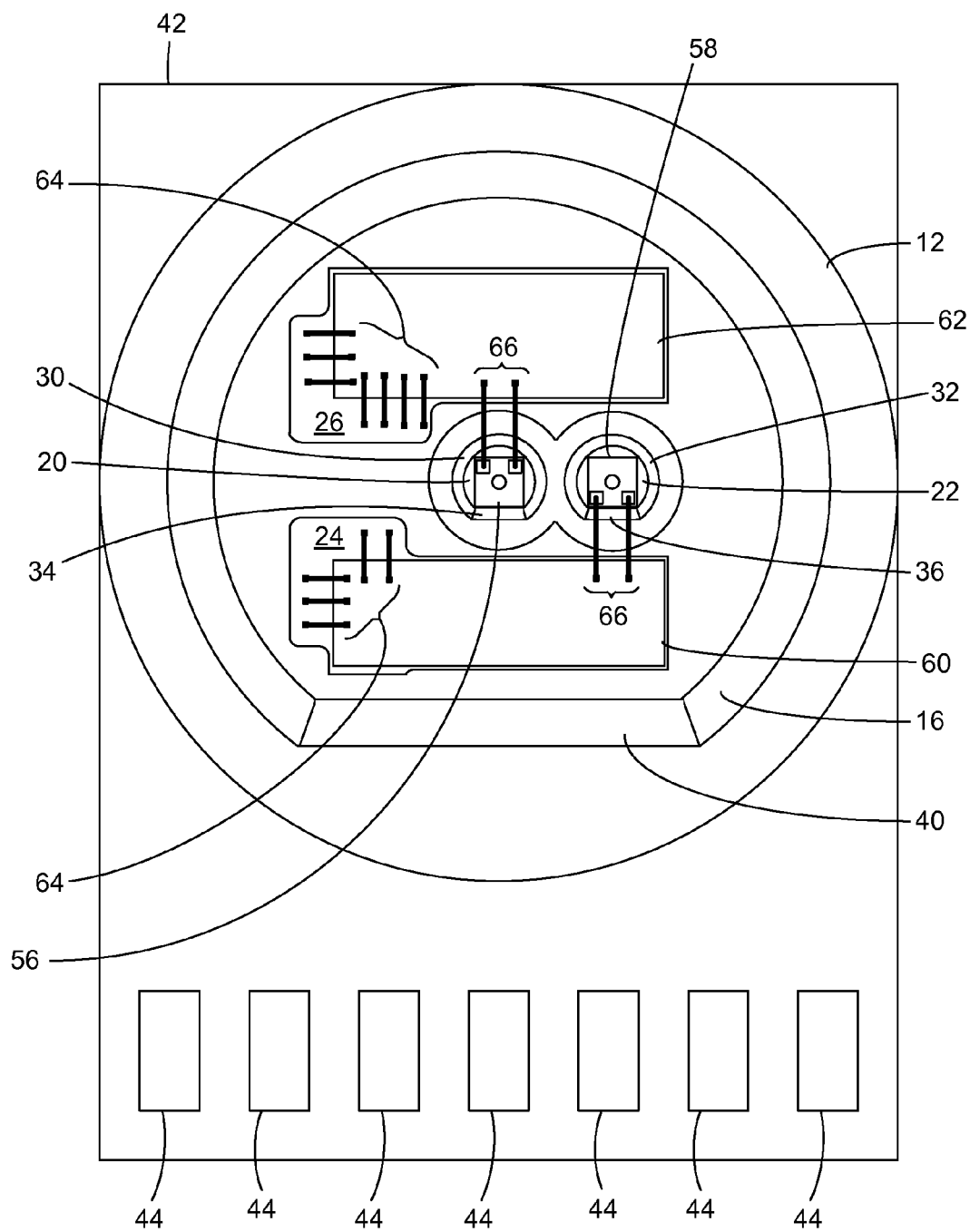
FIG. 8 is similar to FIG. 7, with electronic circuit devices mounted in third and fourth openings in the aligner device.

As illustrated in FIG. 8, a first electronic device 60, such as an integrated circuit chip having driver circuitry, can be placed in first electronic device opening 24, and a second electronic device 62, such as an integrated circuit chip having receiver circuitry, can be placed in second opto-electronic device opening 26. A conventional pick-and-place machine can be used to place first and second electronic devices 60 and 62. The shapes of first and second electronic device opening 24 and 26 can correspond to the shapes of first and second electronic devices 60 and 62, thereby aiding placement. Wirebonds 64 can be provided to electrically connect first and second electronic devices 60 and 62 to contact pads 46 (FIG. 7). Similarly, other wirebonds 66 can be provided to electrically connect first and second opto-electronic devices 56 and 58 to first and second electronic devices 60 and 62.

Figure 9:
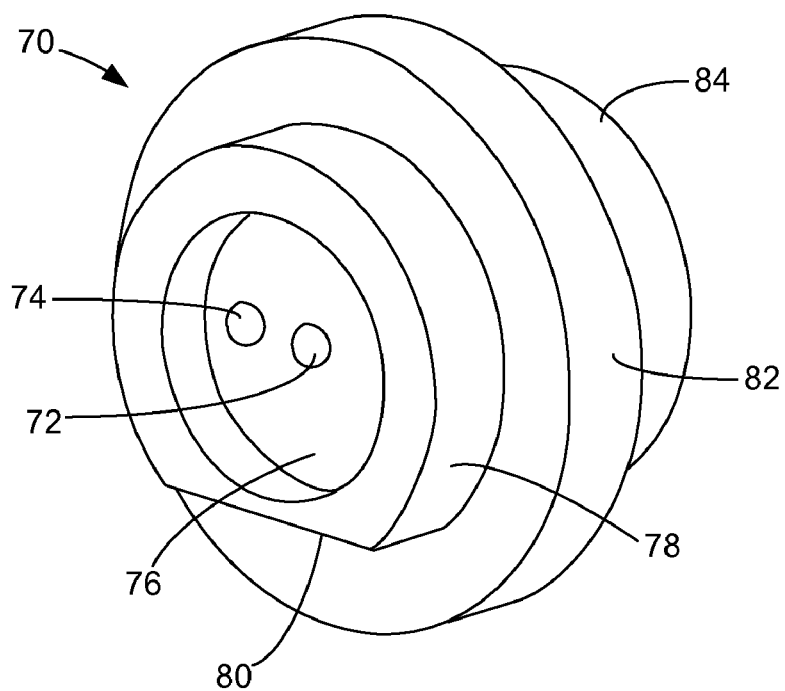
FIG. 9 is a perspective view of a lens device in accordance with the exemplary embodiment of the invention, showing the rear of the lens device.
Figure 10:
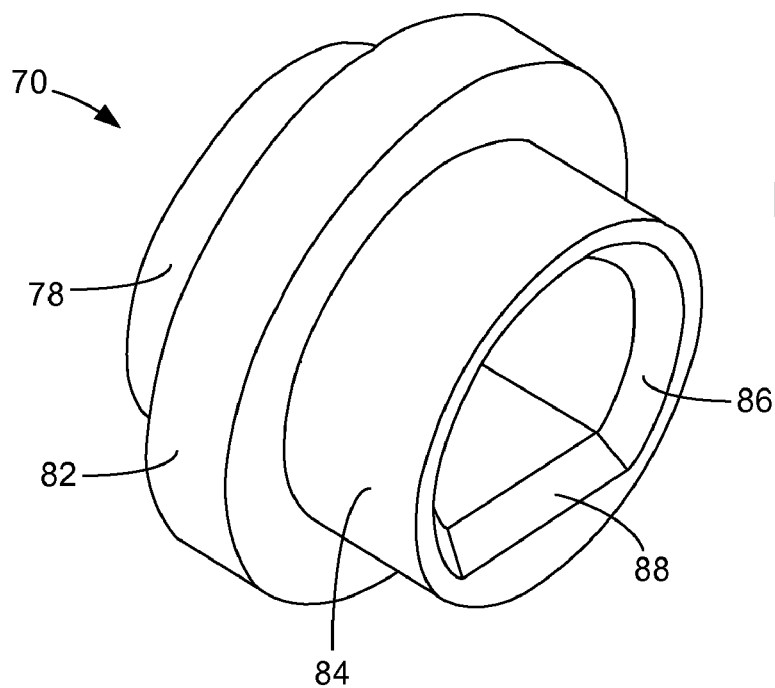
FIG. 10 is similar to FIG. 9, showing the front of the lens device.
Figure 11:
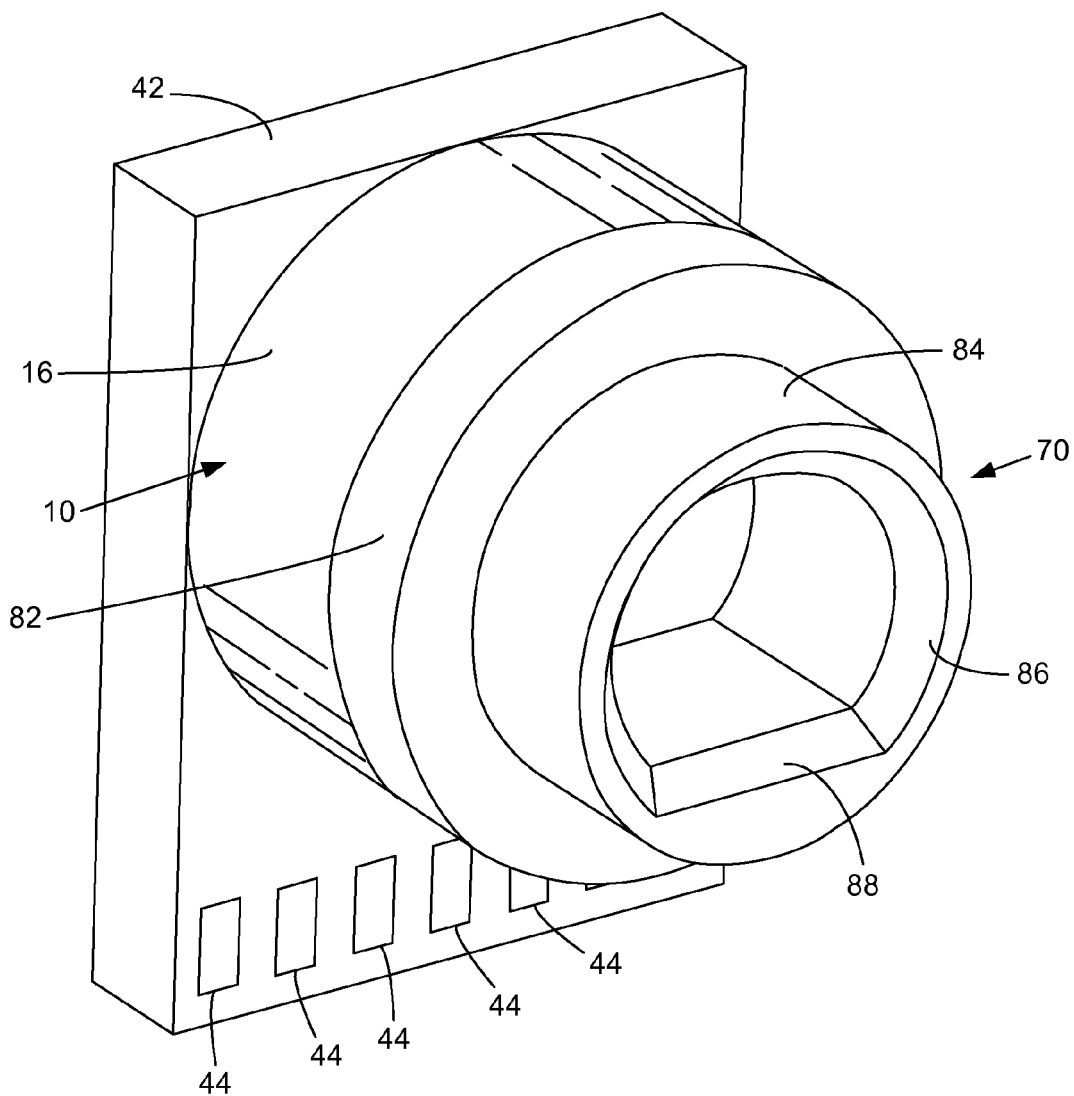
FIG. 11 is a perspective view of the assembly of FIG. 8, with the lens device of FIGS. 9-10 mounted on the aligner device.

As illustrated in FIGS. 9-11, a lens device 70 can be mounted to outer ring 16 of aligner device 10. Lens device 70 can be made of an optical material such as the same ULTEM® polyetherimide of which aligner device 10 can be made. Lens device 70 includes two lenses 72 and 74 (FIG. 9) in a circular region 76 within an inner ring 78. Inner ring 78 has an outer diameter that fits snugly, i.e., a transitional fit, within outer ring 16 of aligner device 10. Chamfered edge 18 (FIG. 8) of aligner device 10 helps guide lens device 70 into the mounted position shown in FIG. 11. The outer periphery of inner ring 78 includes a straight-edge portion 80 (FIG. 9) that corresponds in shape and position to straight-edged portion 40 (FIG. 8) of outer ring 16. Accordingly, with lens device 70 oriented with respect to aligner device 10 such that straight-edge portion 80 of lens device 70 abuts straight-edged portion 40 of aligner device 10, lens device 70 mounts to inner ring 78 with a transitional fit or, alternatively, a friction fit. Mounted in this manner, lens 72 is aligned along central axis 28 (FIG. 2) with first opto-electronic device 20, and lens 72 is similarly aligned with second opto-electronic device 22.

Figure 12:
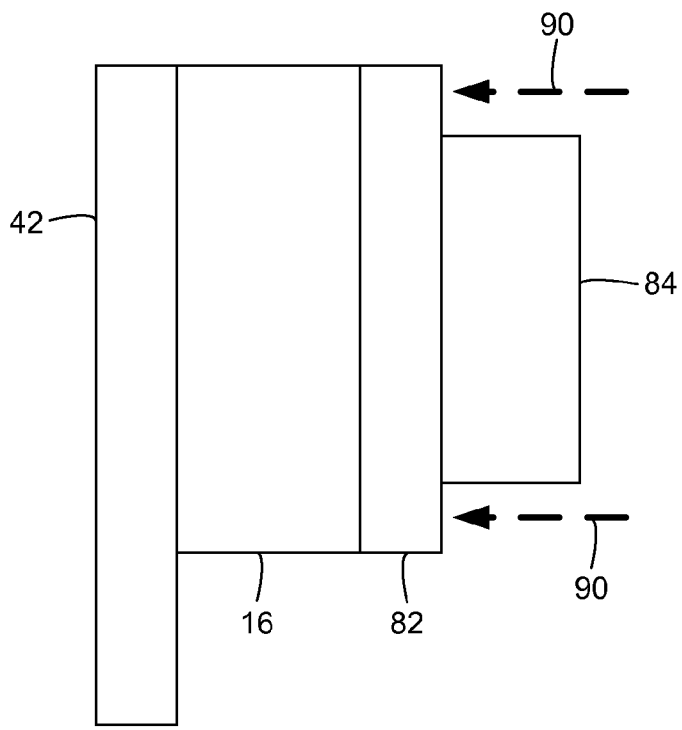
FIG. 12 is a side elevation view of the assembly of FIG. 11, showing laser welding of the lens device to the assembly.

Lens device 70 has a flange 82 that abuts outer ring 16 of aligner device 10 when lens device 70 is mounted to outer ring 16. Lens device 70 also has a barrel portion 84 with a chamfered circular opening 86 and chamfered straight-edge portion 88 that facilitate mounting another optical element, such as an optical cable ferrule (not shown). As illustrated in FIG. 12, a laser welding beam 90 can be directed around flange 82 to weld lens device 70 to aligner device 10. Lens device 70 can be made of a material, such as the above-referenced ULTEM® polyetherimide, that is optically transparent to the wavelength of laser welding beam 90, while aligner device 10 can be made of a similar material that is colored to absorb the wavelength and thus generate the welding heat. Although other methods of securing lens device 70 to aligner device 10 are suitable, such as using an adhesive, laser welding in this manner can provide a semi-hermetic seal.

Figure 13:
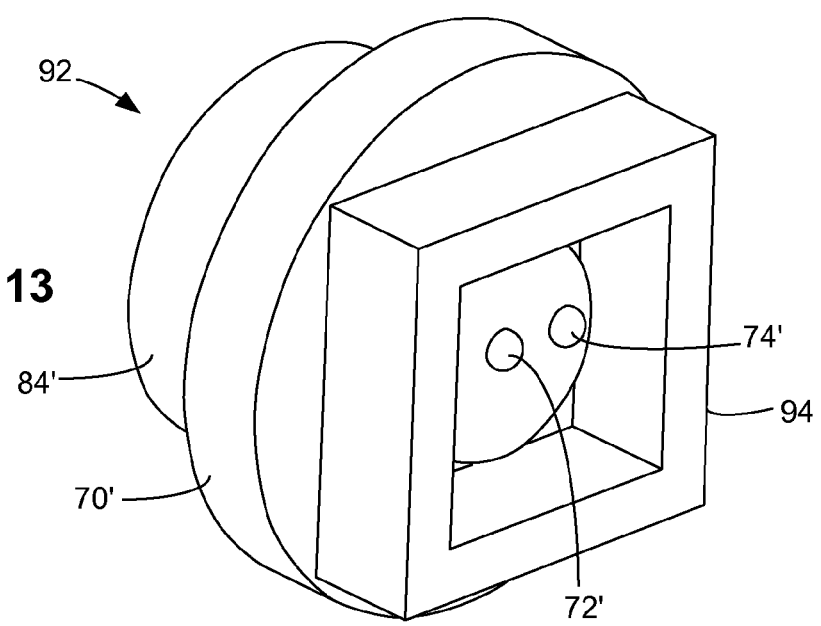
FIG. 13 is a perspective view of an alternative lens device, in accordance with another exemplary embodiment of the invention, showing the rear of the lens device.

Another lens device 92 is illustrated in FIG. 13 that can be included in 92 is similar to lens device 70 (like parts being indicated by like reference numerals having the "prime" symbol, such as 70', 72', 74', and 84'). Lens device 92 has an inner portion 94 with a square profile rather than a circular profile. The corners of the square profile fit within (i.e., a transitional fit or, alternatively, a friction fit) outer ring 16 of aligner device 10.

Figure 14:
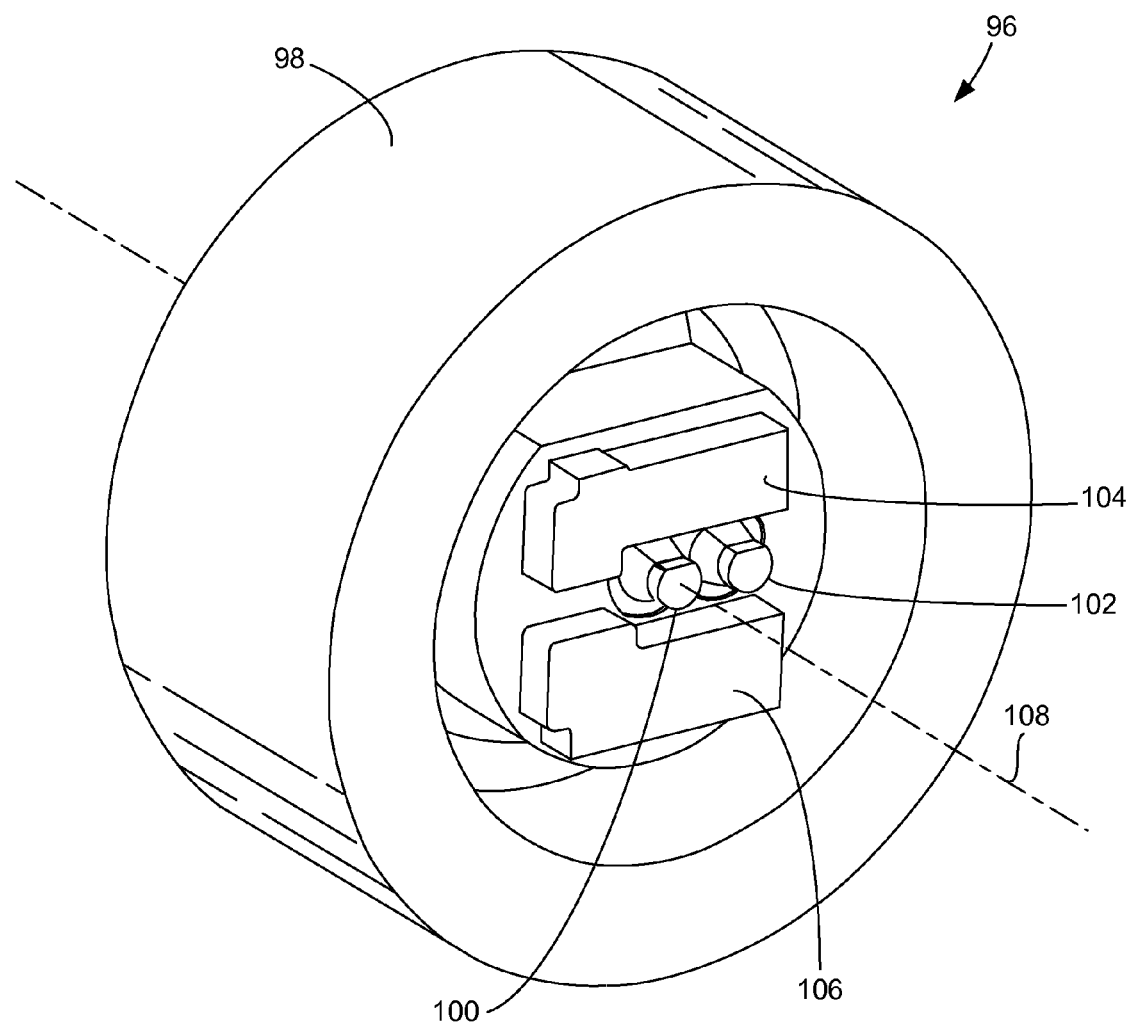
FIG. 14 is a perspective view of a mold tool for forming the aligner device of FIGS. 1-2.

As illustrated in FIG. 14, a mold 96 can be used to manufacture aligner device 10. Mold 96 includes features that correspond to those described above with regard to aligner device 10, such as an outer ring feature 98, a first opto-electronic device opening feature 100, a second opto-electronic device opening feature 102, a first electronic device opening feature 104, a second electronic device opening feature 106, etc. Accordingly, mold 96 can be filled with a suitable thermoplastic material, such as the above-referenced ULTEM® polyetherimide, to mold aligner device 10 therefrom. As such molding operations (e.g., injection molding) are well understood in the art, they are not described in further detail herein.

Mold 96 can be formed to have very precise dimensions by using a diamond lathe or similar machine (not shown) to form first opto-electronic device opening feature 100, outer ring feature 102, or other substantially circular or cylindrical features that are coaxial with or symmetrical about a turning axis 108. When a piece of mold material, such as a suitable metal, is mounted on a lathe and turned about turning axis 108, a feature such as first opto-electronic device opening feature 100 can be tooled into the mold material with high precision with respect to turning axis 108. For example, first opto-electronic device opening feature 100 can be tooled on a conventional diamond lathe to have a radius within about one micron of a desired radius. Similarly, while the mold material (workpiece) remains mounted on the lathe, outer ring feature 98 can be tooled with the same precision. Thus, using a diamond lathe or similarly precise machine, the radius of outer ring feature 98 can be very precisely related to the radius of first opto-electronic device opening feature 100. First opto-electronic device opening feature 100 can be made very precisely coaxial with outer ring feature 98. Accordingly, when mold 96 is made in this manner, making aligner device 10 using mold 96 results in the radius of first electronic device opening 20 being very precisely related to the radius of outer ring 16. First opto-electronic device opening 20 is also very precisely coaxial with outer ring 16.

Thus, the above-described transitional fit between the corners of first opto-electronic device 56 and the circular periphery of first opto-electronic device opening 20 can be provided with substantial precision. Moreover, the alignment between first opto-electronic device opening 20 and outer ring 16 can take advantage of this precision. Accordingly, when lens device 70 is mounted to aligner device 10 in the manner described above, lens 72 is very precisely aligned with first opto-electronic device 56.

In operation, light received from the end of an optical fiber of an optical fiber cable (not shown) or other device that is coupled to lens device 70 is focused by lens 74 upon second opto-electronic device 22. Second opto-electronic device 22, which in the exemplary embodiment is a light receiver such as a photodiode, produces electrical signals in response to the optical signals represented by the light that impinges upon it. First electronic device 60 processes these electrical signals and outputs corresponding output signals via electrical contacts 44. Also, second electronic device 62 receives and processes input signals via electrical contacts 44. First opto-electronic device 20, which in the exemplary embodiment is a light source such as a laser, emits optical signals in response to the electrical signals that it receives from second electronic device 62. Lens 72 of lens device 70 collimates the light emitted by first opto-electronic device 20 into a beam directed at the end of another optical fiber (not shown) of the optical fiber cable or other device that is coupled to lens device 70.

Figure 15:
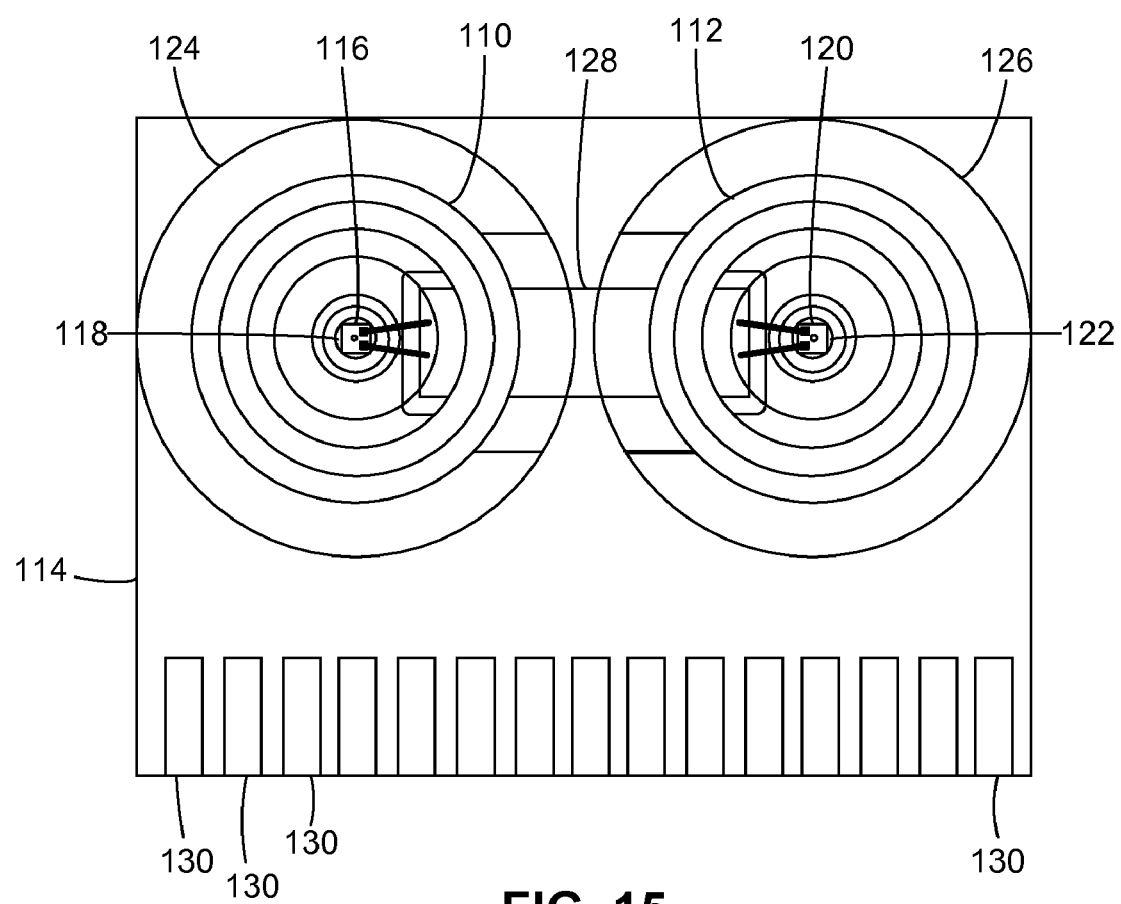
FIG. 15 is a top plan view of an alternative assembly of an aligner device, substrate and lens devices, in accordance with still another exemplary embodiment of the invention.

Another embodiment is illustrated in FIG. 15. In this embodiment, two aligner devices 110 and 112 are mounted on a substrate 114. A first opto-electronic device 116 is mounted in an opening 118 in aligner device 110 in a manner similar to that in the above-described embodiment. Likewise, a second opto-electronic device 120 is mounted in an opening 122 in aligner device 112. That is, aligner devices 110 and 112 and their openings 118 and 122, respectively, can be made and used in a manner similar to the above-described manner in which aligner device 10 and its first opto-electronic device opening 20 are made and used. Lens devices 124 and 126, which are similar to above-described lens device 70, can be mounted to aligner devices 110 and 112, respectively. In the illustrated embodiment, one of opto-electronic devices 116 and 120 can be a light source, and the other can be a light receiver. However, in other embodiments they can both be light sources or, alternatively, they can both be light receivers. An electronic device 128 can also be mounted on substrate 114 and be electrically connected to both of aligner devices 110 and 112. In still other embodiments (not shown), each of two opto-electronic devices that are mounted in separate aligner devices can be electrically connected to separate electronic devices. Substrate 114 can otherwise be similar to above-described substrate 42 and can include, for example, an array of electrical contacts 130, heat sink pads and traces (not shown), etc. Although in the illustrated embodiment there are two aligner devices 110 and 112 and associated lens devices 124 and 126, in other embodiments there can be more than two.

Figure 16:
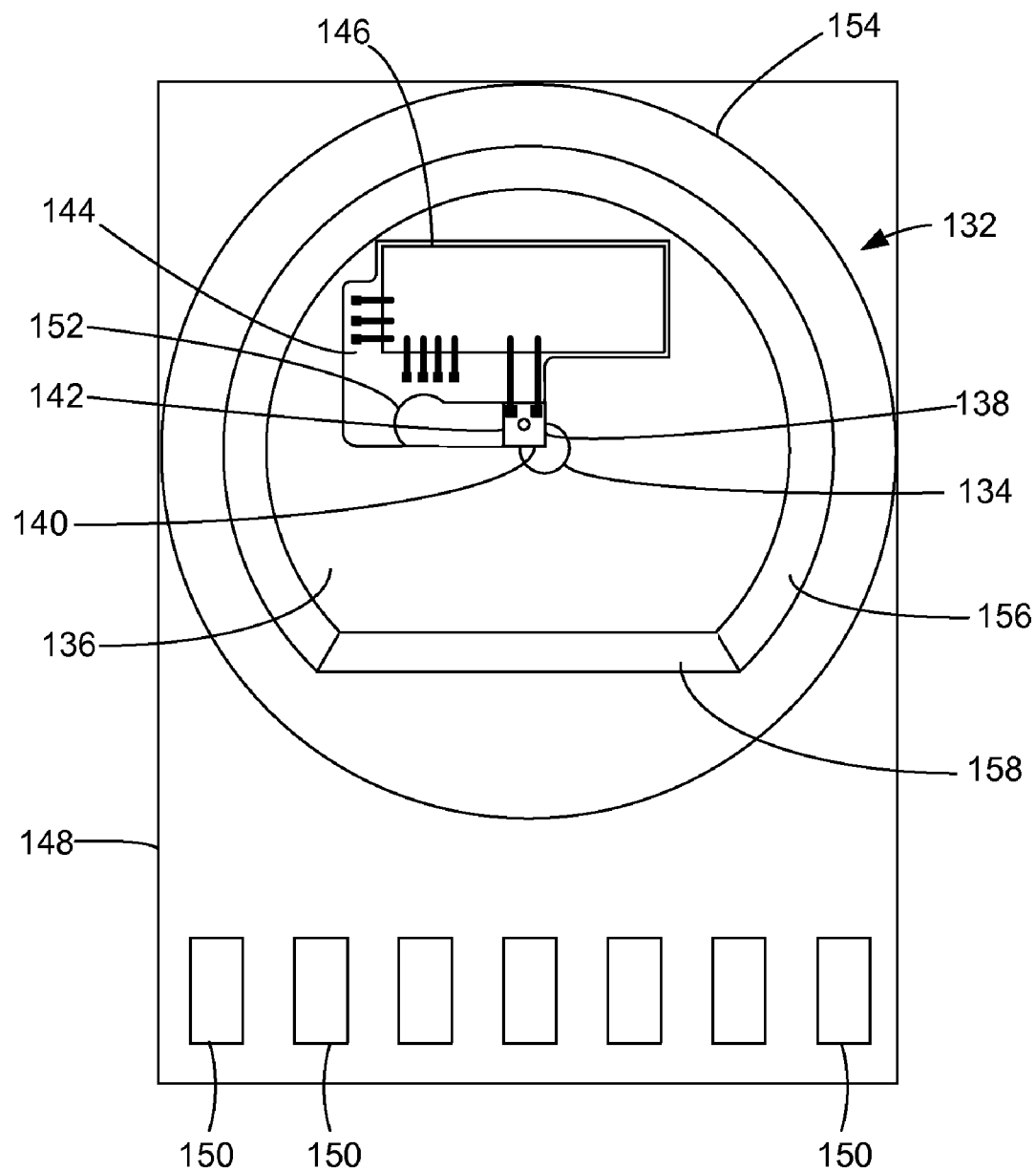
FIG. 16. is a top plan view of still another alternative assembly of an aligner device, substrate and lens devices, in accordance with still another exemplary embodiment of the invention.

Still another embodiment is illustrated in FIG. 16. In this embodiment, an aligner device 132 has an opto-electronic device opening 134 formed in its base 136. Opto-electronic device opening 134 has a substantially circular periphery with two straight edges 138 and 140. More specifically, in the illustrated embodiment the circular periphery of opto-electronic device opening 134 extends over 270 degrees (i.e., ¾ of a circle), and straight edges 138 and 140 bound a 90-degree (i.e., ¼ of a circle) quadrant of the circular periphery. Straight edges 138 and 140 help align an opto-electronic device 142 that is placed into this quadrant of opto-electronic device opening 134. Opto-electronic device opening 134 adjoins a larger electronic device opening 144 in which an electronic device 146 can be mounted. Aligner device 132 is mounted on a substrate 148 that can include an array of electrical contacts 150, a heat sink pad 152, and other elements similar to those described above with regard to substrate 42 of the above-described embodiment shown in FIGS. 1-13. As in that above-described embodiment, the body of aligner device 132 has an outer ring 154 with a chamfered edge 156 and chamfered straight-edged portion 158. A lens device (not shown) can be mounted to outer ring 154 in the same manner as in the above-described embodiment.

Figure 17:
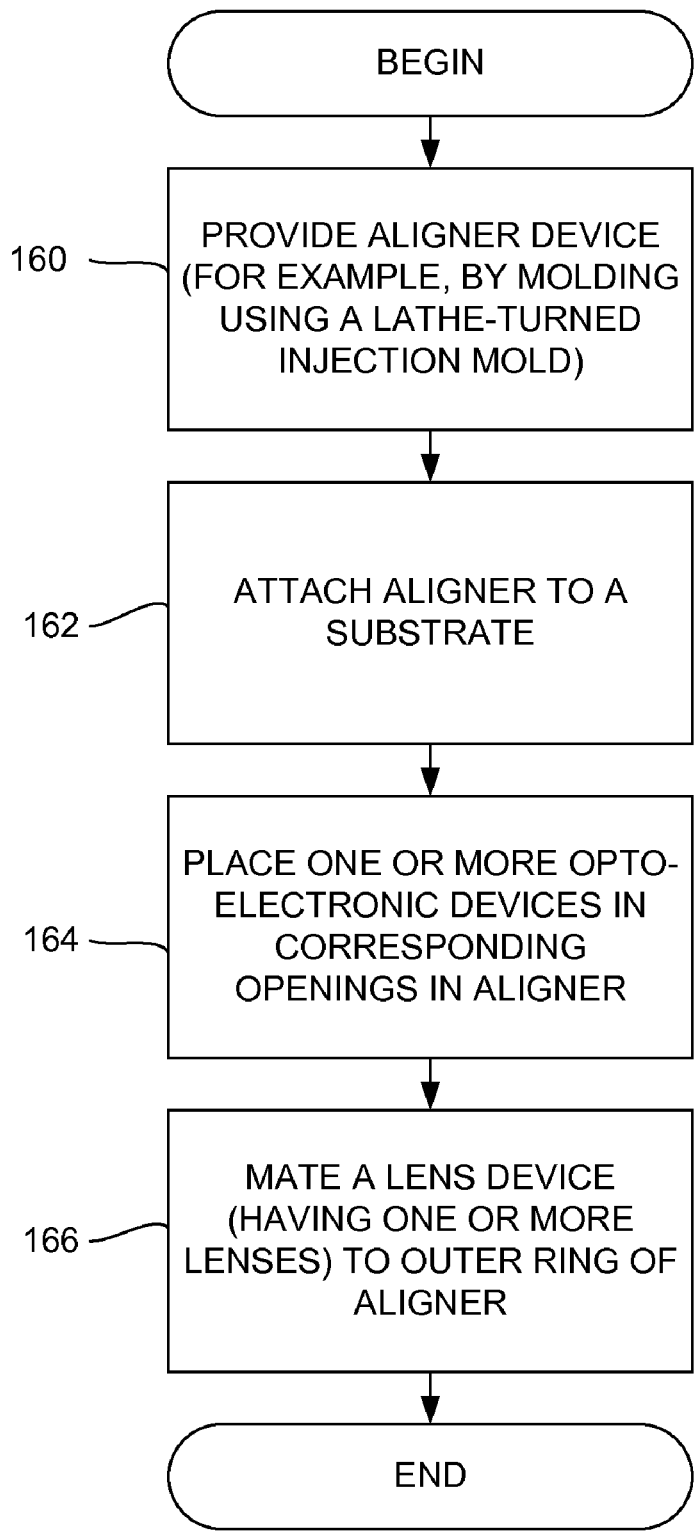
FIG. 17 is a flow diagram illustrating a method for aligning one or more lenses with one or more opto-electronic devices, in accordance with an exemplary embodiment of the invention.

As illustrated in FIG. 17, exemplary methods for aligning one or more lenses with one or more opto-electronic devices can be summarized as follows. As indicated by block 160, an aligner device is provided. For example, as described above, an aligner device can be molded using a mold that is made by turning it in a diamond lathe so that the openings, rings and other features that are substantially circular or cylindrical and concentric with the central axis can be dimensioned with high precision relative to each other. As indicated by block 162, the aligner device can be attached to a substrate. As indicated by block 164, one or more opto-electronic devices can be placed in one or more corresponding openings in the aligner device. As described above, the peripheries of the openings can guide the devices into the openings and provide a snug fit that retains the devices against movement. Although not shown in FIG. 17, electronic devices such as integrated circuit chips and modules can be similarly mounted in similar openings in the aligner device and electrically connected to the opto-electronic devices. As indicated by block 166, a lens device can be mated to the aligner device. The very precise alignment between the lens device and the aligner device and between the aligner device and an opto-electronic device mounted therein results in similarly precise alignment between the opto-electronic device and the lens device.

One or more illustrative embodiments of the invention have been described above. However, it is to be understood that the invention is defined by the appended claims and is not limited to the specific embodiments described.

What is claimed is:

1. A method for aligning one or more lenses with one or more opto-electronic devices, comprising:
   providing an aligner device, the aligner device having a substantially cylindrical body with a base and an outer ring, the base having a first opto-electronic device opening and a second opto-electronic device opening, the first opto-electronic device opening having a substantially circular shape coaxial with the outer ring and coaxial with a central axis of the aligner device;
   placing a first opto-electronic device in the first opto-electronic device opening, the first opto-electronic device having a periphery of dimensions providing a transitional fit within the first opto-electronic device opening, a periphery of the first opto-electronic device opening providing an alignment surface, the alignment surface of the first opto-electronic device opening aligning the first opto-electronic device with respect to the central axis and retaining the first opto-electronic device against movement with respect to the aligner device away from the central axis;
   placing a second opto-electronic device in the second opto-electronic device opening, the second opto-electronic device having a periphery of dimensions providing a transitional fit within the second opto-electronic device opening; and
   mating a lens device to the outer ring of the aligner device, the lens device including a first lens and a second lens, the lens device and outer ring having mating alignment surfaces, the mating alignment surfaces aligning the first lens with the first opto-electronic device, aligning the second lens with the second opto-electronic device, and retaining the lens device against movement with respect to the aligner device.

2. The method claimed in claim 1, wherein providing an aligner device comprises providing an aligner device having a straight-edged portion formed in the first opto-electronic device opening to retain the first opto-electronic device against rotational movement with respect to the aligner device.

3. The method claimed in claim 1, wherein providing an aligner device comprises:
   forming a molding tool having a cylindrical portion;
   turning the cylindrical portion of the molding tool on a lathe to form mold features corresponding to the first opto-electronic device opening and the outer ring; and
   molding the body of the aligner device using the molding tool.

4. The method claimed in claim 3, wherein turning the cylindrical portion on a lathe comprises diamond turning.

5. The method claimed in claim 4, wherein providing an aligner device comprises providing an aligner device further having a second electronic device opening in the base of the body, and wherein the method further comprises placing a second electronic device in the second electronic device opening.

6. The method claimed in claim 1, wherein providing an aligner device comprises providing an aligner device having a central circular opening with a chamfered edge, and wherein placing a first opto-electronic device in the first opto-electronic device opening comprises the chamfered edge guiding the first opto-electronic device into the first opto-electronic device opening.

7. The method claimed in claim 1, wherein providing an aligner device comprises providing an aligner device further having a first electronic device opening in the base of the body, and wherein the method further comprises placing a first electronic device in the first electronic device opening.

8. The method claimed in claim 1, further comprising:
   attaching the aligner device to a substantially planar substrate; and
   attaching the first opto-electronic device to the substrate.

9. The method claimed in claim 8, wherein the substrate comprises a printed circuit board.

10. The method claimed in claim 1, wherein providing the aligner device comprises providing an aligner device having a first opto-electronic device opening that includes one or more straight edges.

11. A method for aligning one or more lenses with one or more opto-electronic devices, comprising:
providing an aligner device, the aligner device having a substantially cylindrical body with a base and an outer ring, the base having a first opto-electronic device opening and a second opto-electronic device opening, the first opto-electronic device opening having a substantially circular shape coaxial with the outer ring and coaxial with a central axis of the aligner device;
placing a first opto-electronic device having a substantially square shape in the first opto-electronic device opening, the first opto-electronic device having a periphery of dimensions providing a transitional fit within the first opto-electronic device opening, a periphery of the first opto-electronic device opening providing an alignment surface, the alignment surface of the first opto-electronic device opening aligning the first opto-electronic device with respect to the central axis and retaining the first opto-electronic device against movement with respect to the aligner device away from the central axis;
placing a second opto-electronic device having a square shape in the second opto-electronic device opening, the second opto-electronic device having a periphery of dimensions providing a transitional fit within the second opto-electronic device opening, a periphery of the first opto-electronic device opening providing an alignment surface, the alignment surface of the first opto-electronic device opening aligning the first opto-electronic device with respect to the central axis;
mating a lens device to the outer ring of the aligner device, the lens device including a first lens and a second lens, the lens device and outer ring having mating alignment surfaces for aligning the first lens with the first opto-electronic device, aligning the second lens with the second opto-electronic device, and retaining the lens device against movement with respect to the aligner device;
attaching the aligner device to a substantially planar substrate;
attaching the first opto-electronic device to the substrate; and
attaching the second opto-electronic device to the substrate.

12. The method claimed in claim 11, wherein providing an aligner device comprises providing an aligner device further having a first electronic device opening in the base of the body, and wherein the method further comprises placing a first electronic device in the second electronic device opening.

13. The method claimed in claim 11, wherein providing an aligner device comprises providing an aligner device further having a second electronic device opening in the base of the body, and wherein the method further comprises placing a second electronic device in the second opto-electronic device opening.

14. The system claimed in claim 13, wherein the substrate comprises a printed circuit board.

15. The system claimed in claim 13, wherein the aligner device has a first electronic device opening in the base of the body, and further comprising a first electronic device in the third opening attached to the substrate.

16. The system claimed in claim 15, wherein the aligner device has a second electronic device opening in the base of the body, and further comprising a second electronic device in the fourth opening attached to the substrate.

17. A system having one or more lenses aligned with one or more opto-electronic devices, comprising:
a substantially planar substrate;
an aligner device having a substantially cylindrical body with a base and an outer ring, the base mounted on the substrate, the base having a first opto-electronic device opening and a second opto-electronic device opening, the first opto-electronic device opening having a substantially circular shape coaxial with the outer ring and coaxial with a central axis of the aligner device;
a first opto-electronic device mounted on the substrate in the first opto-electronic device opening, the first opto-electronic device having a periphery of dimensions providing a transitional fit within the first opto-electronic device opening, a periphery of the first opto-electronic device opening providing an alignment surface, the alignment surface of the first opto-electronic device opening aligning the first opto-electronic device with respect to the central axis;
a second opto-electronic device mounted on the substrate in the second opto-electronic device opening; and
a lens device attached to the outer ring of the aligner device, the lens device including a first lens and a second lens, the lens device and outer ring having mating alignment surfaces for aligning the first lens with the first opto-electronic device and aligning the second lens with the second opto-electronic device.

18. The system claimed in claim 17, wherein the first opto-electronic device opening of the aligner device has a chamfered edge.

19. The system claimed in claim 17, wherein the periphery of the first opto-electronic device opening of the aligner device includes one or more straight-edged portions.

* * * * *